US008418012B2

(12) United States Patent (10) Patent No.: US 8,418,012 B2
Blostic et al. (45) Date of Patent: Apr. 9, 2013

(54) METHOD OF ANALYZING THE SAFETY OF A DEVICE EMPLOYING ON TARGET HARDWARE DESCRIPTION LANGUAGE BASED FAULT INJECTION

(75) Inventors: Kevin Joseph Blostic, Bentleyville, PA (US); James Jacob Riling, Pittsburgh, PA (US); Adam Edward Szymkowiak, Sewickley, PA (US); Todd Anthony DeLong, Ivy, VA (US); Joseph William Reutzel, Pittsburgh, PA (US); Anthony Pietro Mancini, II, Jefferson Hills, PA (US)

(73) Assignee: Ansaldo STS USA, Inc., Pittsburgh, PA (US)

( * ) Notice: Subject to any disclaimer, the term of this patent is extended or adjusted under 35 U.S.C. 154(b) by 0 days.

(21) Appl. No.: 13/238,382

(22) Filed: Sep. 21, 2011

(65) Prior Publication Data

US 2012/0216091 A1 Aug. 23, 2012

Related U.S. Application Data

(60) Provisional application No. 61/384,857, filed on Sep. 21, 2010.

(51) Int. Cl.
*G06F 11/00* (2006.01)
(52) U.S. Cl.
USPC ............................................ 714/741; 714/742
(58) Field of Classification Search .................. 702/117; 716/104; 714/33, 726, 737, 741, 742
See application file for complete search history.

(56) References Cited

U.S. PATENT DOCUMENTS

| 4,769,817 | A | * | 9/1988 | Krohn et al. ..................... 714/33 |
|---|---|---|---|---|
| 4,774,493 | A | | 9/1988 | Rabinowitz |
| 4,996,688 | A | | 2/1991 | Byers et al. |
| 4,999,837 | A | | 3/1991 | Reynolds et al. |
| 5,410,548 | A | | 4/1995 | Millman |
| 5,475,624 | A | | 12/1995 | West |
| 5,475,695 | A | | 12/1995 | Caywood et al. |
| 5,513,339 | A | | 4/1996 | Agrawal et al. |
| 5,596,586 | A | | 1/1997 | Sakai |
| 5,604,895 | A | | 2/1997 | Raimi |
| 5,870,410 | A | | 2/1999 | Norman et al. |
| 6,044,214 | A | | 3/2000 | Kimura et al. |
| 6,536,008 | B1 | * | 3/2003 | Nadeau-Dostie et al. .... 714/726 |
| 6,594,610 | B1 | * | 7/2003 | Wells et al. .................... 702/117 |
| 6,704,894 | B1 | | 3/2004 | Kania |
| 6,971,048 | B1 | | 11/2005 | Hanson et al. |

(Continued)

*Primary Examiner* — David Ton
(74) *Attorney, Agent, or Firm* — Eckert Seamans Cherin & Mellott, LLC; Philip E. Levy

(57) ABSTRACT

A method of testing a target electronic device implemented in a configurable integrated circuit device includes receiving a baseline design for the target electronic device in a hardware description language, establishing a fault model for the particular configurable integrated circuit device, synthesizing the fault model in the hardware description language, embedding the synthesized fault model into the baseline design to create a modified baseline design in the hardware description language which enables one or more targeted signals to be selectively corrupted, creating a fault model enabled target device on the particular configurable integrated circuit device using the modified baseline design, performing a number of fault injection experiments on the fault model enabled target device, wherein each fault injection experiment includes causing at least one of the one or more targeted signals to be corrupted within the fault model enabled target device.

13 Claims, 2 Drawing Sheets

U.S. PATENT DOCUMENTS

| | | |
|---|---|---|
| 7,284,159 B2 | 10/2007 | Chakraborty et al. |
| 7,284,274 B1 | 10/2007 | Walls et al. |
| 7,437,701 B1 | 10/2008 | Dutra et al. |
| 7,509,551 B2 | 3/2009 | Koenemann et al. |
| 7,689,866 B2 | 3/2010 | Chakraborty |
| 7,818,644 B2 | 10/2010 | Rajski et al. |
| 7,937,679 B2 * | 5/2011 | Mariani ................ 716/104 |
| 2004/0078175 A1 | 4/2004 | Shaw et al. |
| 2007/0143718 A1 | 6/2007 | Abercrombie et al. |
| 2008/0201670 A1 | 8/2008 | Rinderknecht et al. |
| 2008/0276206 A1 | 11/2008 | Mariani |
| 2009/0177936 A1 * | 7/2009 | Koenemann et al. ......... 714/737 |
| 2010/0146338 A1 | 6/2010 | Schalick et al. |

* cited by examiner

METHOD OF ANALYZING THE SAFETY OF A DEVICE EMPLOYING ON TARGET HARDWARE DESCRIPTION LANGUAGE BASED FAULT INJECTION

CROSS-REFERENCE TO RELATED APPLICATIONS

This application claims priority under 35 U.S.C. §119(e) from U.S. Provisional Application No. 61/384,857, entitled "On-Target VHDL Based Fault Injection as Part of System Safety Analysis", filed on Sep. 21, 2010, the disclosure of which is incorporated herein by reference.

BACKGROUND OF THE INVENTION

1. Field of the Invention

The present invention relates to the design and testing of safety critical electronic devices, and in particular to a method of testing a safety critical target electronic device implemented in a particular type of configurable integrated circuit device, such as a field programmable gate array (FPGA) or a complex programmable logic devices (CPLD), that employs on target hardware description language based fault injection.

2. Description of the Related Art

For safety critical electronic devices, such as, without limitation, circuits/systems used in the control and/or detection of trains in railroad or mass transit systems, it is typically necessary to perform an extensive safety analysis of the device before it can be implemented in the field. The purpose of the safety analysis is to establish that, if particular random faults, e.g., shorts or other similar component failures, in the device were to occur (which in fact may happen from time to time), the risk of a resulting hazard would be acceptable because such faults would: (i) be detected by software diagnostics forming a part of the device, and (ii) result in the device behaving in a safe fashion (i.e., defaulting to a safe operational state).

In addition, many current safety critical electronic devices, such as those from the railroad or mass transit industry described above, are implemented using configurable integrated circuit devices, such as field programmable gate arrays or complex programmable logic devices, that are able to be selectively configured by a user after manufacture using a hardware description language such as VHDL. However, the effects of faults in such configurable integrated circuit devices cannot be quantified with an acceptable confidence level using current known qualitative techniques, such as failure mode and effects analysis (FMEA) and failure mode, effects and criticality analysis (FMECA). As a result, there are currently no known techniques for effectively performing an extensive quantitative fault based safety analysis of a safety critical electronic device that is implemented using a configurable integrated circuit device such as an FPGA or CPLD. A need for such a technique thus exists. Furthermore, given the current trend toward increased use of configurable integrated circuit devices in modern electronics design, the need for such a technique is particularly keen.

SUMMARY OF THE INVENTION

In one embodiment, a method of testing a target electronic device is provided, wherein the target electronic device is to be implemented in a particular type of configurable integrated circuit device, such as an FPGA or a CPLD. The method includes receiving a baseline design for the target electronic device in a hardware description language (such as VHDL or Verilog), establishing a fault model for the particular configurable integrated circuit device, synthesizing the fault model in the hardware description language, embedding the synthesized fault model into the baseline design to create a modified baseline design in the hardware description language which enables one or more targeted signals to be selectively (randomly in the exemplary embodiment) corrupted, creating a fault model enabled target device on the particular configurable integrated circuit device using the modified baseline design, performing a number of fault injection experiments on the fault model enabled target device, wherein each fault injection experiment includes causing at least one of the one or more targeted signals to be corrupted within the fault model enabled target device. In one exemplary embodiment, product response to injected faults is monitored as well.

Therefore, it should now be apparent that the invention substantially achieves all the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the invention, and together with the general description given above and the detailed description given below, serve to explain the principles of the invention. As shown throughout the drawings, like reference numerals designate like or corresponding parts.

DETAILED DESCRIPTION OF THE EXEMPLARY EMBODIMENTS

Figure 1:
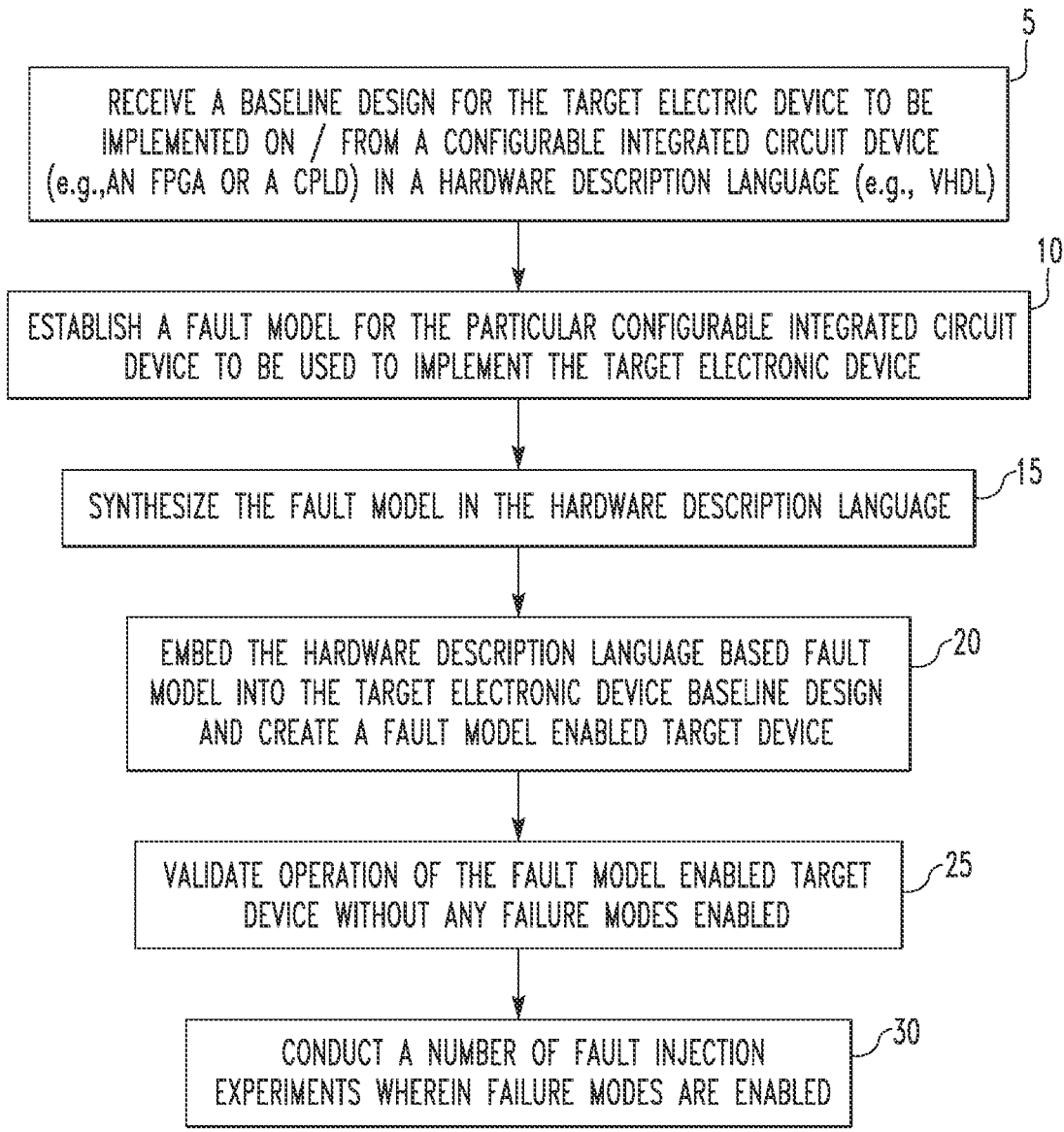
FIG. 1 is a flowchart showing a method of designing and testing a safety critical target electronic device according to one exemplary embodiment of the present invention.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

As employed herein, the statement that two or more parts or components are "coupled" together shall mean that the parts are joined or operate together either directly or through one or more intermediate parts or components.

As employed herein, the statement that two or more parts or components "engage" one another shall mean that the parts exert a force against one another either directly or through one or more intermediate parts or components.

As employed herein, the term "number" shall mean one or an integer greater than one (i.e., a plurality).

FIG. 1 is a flowchart showing a method of designing and testing a safety critical target electronic device, such as, without limitation, a circuit/system used in the control and/or detection of a trains in a railroad or mass transit system, according to one exemplary embodiment of the present invention. As described below, the safety critical target electronic device is implemented using a configurable integrated circuit device, such as an FPGA or CPLD, and the method provides for the extensive fault based safety analysis of the target electronic device.

The method begins at step 5, wherein a baseline design for the target electronic device in a suitable hardware description language (HDL), such as, without limitation, VHDL or Verilog, is received from the designer (the designer may or may not be the same person or person doing the testing). At this stage, the designer will also have chosen the particular type of configurable integrated circuit device that is to be used in implementing the target electronic device, including the particular brand/maker and model thereof. Next, at step 10, a fault model for the chosen configurable integrated circuit device (including the particular brand/maker and model thereof) is established. The fault model will specify and represent the ways in which chosen configurable integrated circuit device can fail, including a number of particular failure modes for the device. Typically, the fault model will be generated by performance research on the device, including extensive testing and observation of an actual device under numerous operating conditions.

At step 15, the fault model is then synthesized in the hardware description language that was used in the baseline design for the target electronic device. Next, at step 20, the fault model synthesized in the hardware description language is embedded in the target electronic device baseline design. A fault model enabled target electronic device is then created based thereon. In particular, in the exemplary embodiment, step 20 involves the following process steps. First, the raw HDL code (e.g., VHDL code) of the fault model, and associated peripheral control and monitoring blocks synthesized in HDL code (e.g., VHDL code), are added to the baseline HDL design for the target electronic device (that is ultimately to be embedded onto the chosen configurable integrated circuit device (e.g., FPGA or CPLD)). This is done so that those HDL files (the fault model and the peripheral control and monitoring) can be used as components inside the baseline design. Next, targeted signals inside the baseline HDL design are broken, and fault model HDL components are placed in between the source and destination of those signals. This is done so that those targeted signals can be corrupted by the fault model behavior. Once all of the specified signals have fault models components embedded as just described, the entire modified baseline design is then compiled and synthesized with the fault model embedded. Finally, the modified/new design, with the embedded fault model components, is loaded onto the target configurable integrated circuit device (e.g., an FPGA or CPLD) to create the fault model enabled target device.

Then, at step 25, the operation of the fault model enabled target electronic device that was generated in step 20 is validated without any of the failure modes of the fault model being enabled. More specifically, a test sequence is initiated where the fault model enabled target electronic device is subjected to various operating scenarios (i.e. input conditions) for which the output states of the fault model enabled target electronic device must comply with the established product safety requirements. This step provides confidence that the addition of the fault model to the baseline design did not compromise the functional operation of the target electronic device. Next, at step 30, a number of fault injection experiments are conducted on the fault model enabled target electronic device. In the exemplary embodiment, the experiments are predetermined using a statistical model and desired confidence intervals. Furthermore, in each experiment a selected failure mode of the fault model is enabled and the fault model enabled target electronic device is subjected to the same operating scenarios (i.e. input conditions) as described above. This allows real system behavior to be monitored and recorded in real time. It is important to note that, during these fault injection experiments, multiple signals may be corrupted simultaneously, with the real time response being monitored and recorded. Each fault injection experiment trial must yield one of the following two results for the baseline design of the target electronic device to be deemed acceptable: (1) the injected fault condition is detectable by software diagnostics (e.g., built into the target electronic device as part of the baseline design or forming part of a separate product or component) and in response to the injected fault condition the target electronic device (i.e., the fault model enabled target electronic device in the test procedure) is placed in a safe restricted operating state (e.g. outputs disabled), or (2) the injected fault condition is not detectable by the software diagnostics but the target electronic device (i.e., the fault model enabled target electronic device in the test procedure) outputs comply with established product safety requirements. Any other result is unacceptable and will require a re-design of the baseline design for the target electronic device.

In one aspect, the peripheral control and monitoring blocks embedded in the baseline design as described above includes functionality wherein for each fault injection experiment, a determination is made as to whether an actual circuit corruption was created, a confirmation feedback signal is provided indicating whether or not such a corruption was in fact created. If, for any experiments, a corruption was not created, then that experiment would not be considered valid. For example, a signal shorted to a 0 that is already sitting at 0 is not corrupting the signal and should not be considered a valid experiment.

Figure 2:
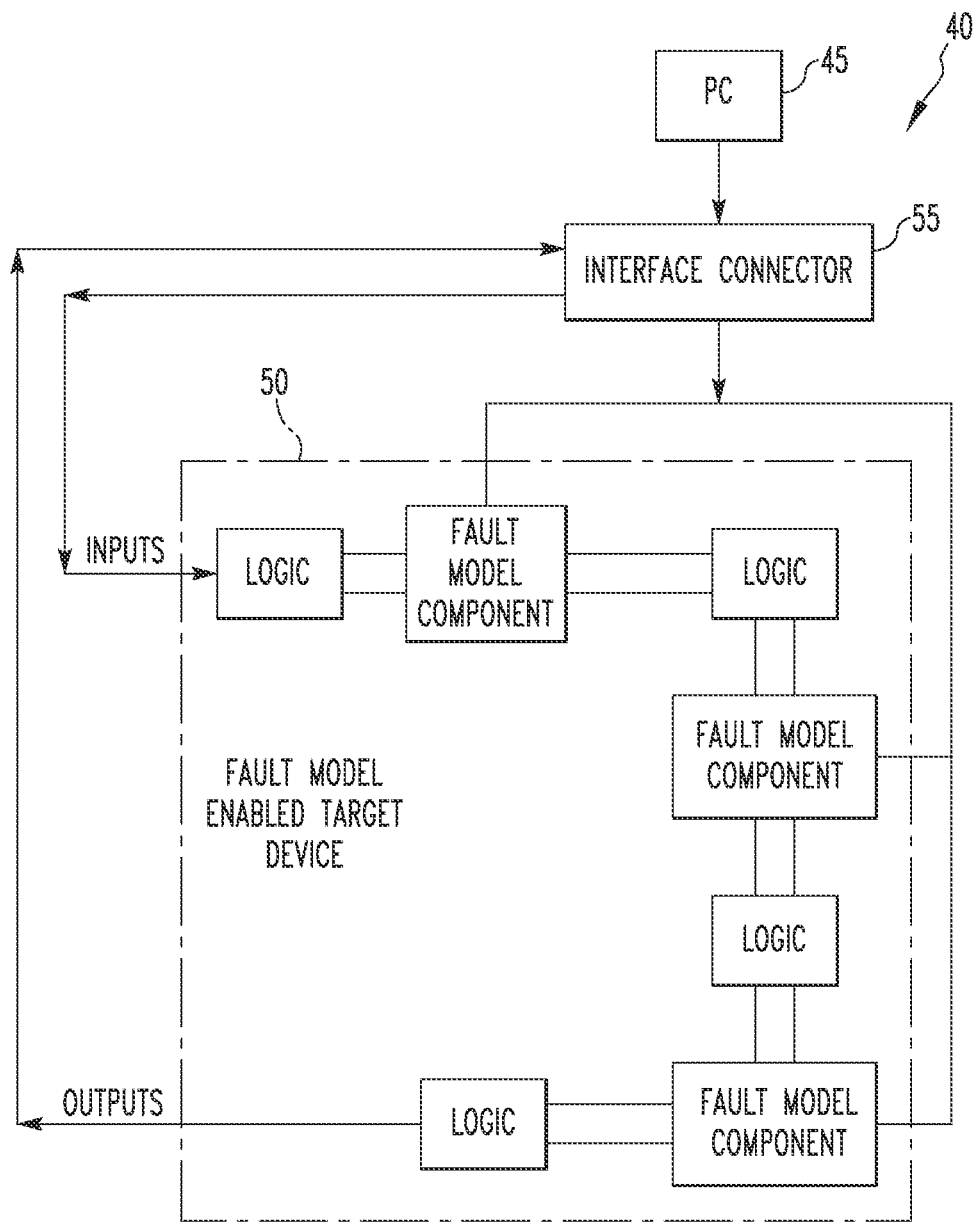
FIG. 2 is a schematic diagram of an exemplary test environment that may be used in the method of FIG. 1.

FIG. 2 is a schematic diagram of an exemplary test environment 40 that may be used in steps 25 and 30 described above. The exemplary test environment 40 includes a PC 45 that runs command, control and monitoring software, the fault model enabled target electronic device, labeled with the reference numeral 50, and a multi-use interface connector 55 used to couple the PC to the fault model enabled target electronic device. The command, control and monitoring software running on PC 45 enables fault/failure modes to be randomly enabled in order to execute the fault injection experiments described above, and monitors and records the results of the fault injection experiments.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of testing a target electronic device, wherein the target electronic device is to be implemented in a particular configurable integrated circuit device, comprising:

receiving a baseline design for the target electronic device in a hardware description language;

establishing a fault model for the particular configurable integrated circuit device;

synthesizing the fault model in the hardware description language;

embedding the synthesized fault model into the baseline design to create a modified baseline design in the hardware description language which enables one or more targeted signals to be selectively corrupted;

creating a fault model enabled target device on the particular configurable integrated circuit device using the modified baseline design; and performing a number of fault injection experiments on the fault model enabled target device, wherein each fault injection experiment includes causing at least one of the one or more targeted signals to be corrupted within the fault model enabled target device.

2. The method according to claim 1, wherein the particular configurable integrated circuit device is an FPGA or a CPLD.

3. The method according to claim 1, wherein the creating the baseline design in the hardware description language generates baseline HDL code, wherein the synthesizing the fault model in the hardware description language generates fault model HDL code, and wherein the embedding the synthesized fault model into the baseline design to create a modified baseline design comprises: (i) adding the fault model HDL code to the baseline HDL code in a manner wherein portions of the HDL code can be used as components inside the baseline design, and (ii) breaking each of the one or more targeted signals inside the baseline HDL code and for each of the targeted signals placing a fault model HDL code component in between a source and a destination of the targeted signal such that the targeted signal can be selectively corrupted.

4. The method according to claim 3, wherein the embedding the synthesized fault model into the baseline design also comprises adding peripheral control and monitoring blocks synthesized in the hardware description language to the baseline HDL code.

5. The method according to claim 3, wherein the modified baseline design comprises modified baseline design HDL code, wherein the creating the fault model enabled target device on the particular configurable integrated circuit device using the modified baseline design comprises compiling and synthesizing the modified baseline design HDL code and loading the compiled and synthesized modified baseline design HDL code onto the particular configurable integrated circuit device.

6. The method according to claim 1, wherein the fault model specifies and represents a number of ways in which the particular configurable integrated circuit device can fail, including a number of particular failure modes for the particular configurable integrated circuit device.

7. The method according to claim 1, further comprising after the creating step and before the performing step validating operation of the fault model enabled target device without causing any of the one or more targeted signals to be corrupted within the fault model enabled target device.

8. The method according to claim 1, wherein the validating comprises performing a test sequence wherein the fault model enabled target electronic device is subjected to various operating scenarios for which output states must comply with established safety requirements.

9. The method according to claim 1, wherein the performing a number of fault injection experiments comprises, for each fault injection experiment, monitoring and recording a behavior of the fault model enabled target electronic device in response to the fault injection experiment.

10. The method according to claim 9, for each fault injection experiment, a determination is made as to whether (1) a fault condition is detected by the fault model enabled target electronic device and in response thereto the fault model enabled target electronic device the target electronic device is placed in a safe restricted operating state, or (2) a fault condition is not detected by the fault model enabled target electronic device but in response to fault injection experiment the outputs of the fault model enabled target electronic device comply with established safety requirements.

11. The method according to claim 10, wherein the method included deeming the fault model enabled target electronic device to be acceptable only if for each fault injection experiment (1) or (2) is determined to have occurred.

12. The method according to claim 1, wherein for each fault injection experiment, a determination is made as to whether an actual circuit corruption within the fault model enabled target electronic device was created.

13. The method according to claim 12, further comprising generating a confirmation feedback signal based on the determination as to whether an actual circuit corruption within the fault model enabled target electronic device was created.

* * * * *

UNITED STATES PATENT AND TRADEMARK OFFICE
CERTIFICATE OF CORRECTION

PATENT NO. : 8,418,012 B2
APPLICATION NO. : 13/238382
DATED : April 9, 2013
INVENTOR(S) : Kevin Joseph Blostic et al.

Page 1 of 1

It is certified that error appears in the above-identified patent and that said Letters Patent is hereby corrected as shown below:

Title page, second column, item (56) U.S. PATENT DOCUMENTS, line 13,
"6,594,610 B1* 7/2003 Wells et al." should read --6,594,610 B1* 7/2003 Toutounchi et al.--.

In the Specifications
Column 1, line 23, "devices" should read --device--.
Column 2, line 61, "of a trains" should read --of a train--.
Column 3, line 13, "which chosen" should read --which a chosen--.
Column 3, line 40, "fault models components" should read --fault model components--.

Signed and Sealed this
Sixth Day of August, 2013

Teresa Stanek Rea
*Acting Director of the United States Patent and Trademark Office*